US007076750B1

(12) United States Patent
Lukanc (10) Patent No.: US 7,076,750 B1
(45) Date of Patent: Jul. 11, 2006

(54) METHOD AND APPARATUS FOR GENERATING TRENCHES FOR VIAS

(75) Inventor: Todd P. Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 813 days.

(21) Appl. No.: 09/776,735

(22) Filed: Feb. 6, 2001

(51) Int. Cl.
*G06F 17/50* (2006.01)

(52) U.S. Cl. .................... 716/5; 716/4; 716/6; 257/774
(58) Field of Classification Search ................ 716/4–6, 716/8–11; 438/586, 618; 257/774
See application file for complete search history.

(56) References Cited

U.S. PATENT DOCUMENTS

| 4,946,764 | A | * | 8/1990 | Matsuoka et al. | .......... | 430/325 |
| 5,581,475 | A | * | 12/1996 | Majors | ......................... | 716/10 |
| 5,620,916 | A | * | 4/1997 | Eden et al. | ..................... | 716/10 |
| 5,640,497 | A | | 6/1997 | Woolbright | | |
| 5,712,794 | A | | 1/1998 | Hong | | |
| 5,901,066 | A | | 5/1999 | Hong | | |
| 6,002,851 | A | * | 12/1999 | Basavaiah et al. | ............. | 714/4 |
| 6,038,383 | A | * | 3/2000 | Young et al. | .................... | 716/5 |
| 6,247,853 | B1 | * | 6/2001 | Papadopoulou et al. | ........ | 716/4 |
| 6,249,900 | B1 | * | 6/2001 | Kotani et al. | .................... | 716/5 |
| 6,275,971 | B1 | * | 8/2001 | Levy et al. | ...................... | 716/5 |
| 6,340,631 | B1 | * | 1/2002 | Chih-Po et al. | ............. | 438/618 |
| 6,412,097 | B1 | * | 6/2002 | Kikuchi et al. | ................. | 716/2 |
| 6,425,117 | B1 | * | 7/2002 | Pasch et al. | ................... | 716/21 |
| 6,526,555 | B1 | * | 2/2003 | Teig et al. | ..................... | 716/11 |
| 6,624,056 | B1 | * | 9/2003 | Chandna et al. | ............ | 438/586 |
| 6,753,611 | B1 | * | 6/2004 | Maeno et al. | ................ | 257/774 |
| 6,853,743 | B1 | * | 2/2005 | Kotani et al. | ................ | 382/144 |

* cited by examiner

*Primary Examiner*—Matthew Smith
*Assistant Examiner*—Naum Levin (57) ABSTRACT

A method of checking a computer generated circuit layout involves selecting vias with at least an edge coincident to an edge of a metal line. Once vias are selected, based upon whether a via touches an edge of a metal line, information regarding the distance between metal lines is determined. Metal lines are resized in the vicinity of a via with an edge touching an edge of a metal line in order to effect a complete connection between the metal line and the via in a manufactured integrated circuit taking into account the information regarding the distance between metal lines. Resized metal lines do not impact metal lines adjacent to the edge that a via was touching because adjacent metal lines are resized to account for a too small separation distance if necessary.

14 Claims, 7 Drawing Sheets

METHOD AND APPARATUS FOR GENERATING TRENCHES FOR VIAS

FIELD OF THE INVENTION

The present invention relates to integrated circuit design, and particularly, to the layout of metal lines over vias.

DESCRIPTION OF RELATED ART

Electronic devices, particularly integrated circuits, comprise a large number of components fabricated by layering several different materials onto a silicon wafer. In order for the components to function as an integrated circuit, they are selectively, electrically connected to one another. Metal lines are utilized to electrically connect components within the same layer, while vias are utilized to electrically connect components disposed horizontally of one another. Often, a combination of metal lines and vias is required to connect components within an integrated circuit. When metal lines and vias are utilized to electrically connect components, it is important that a complete connection between the via and metal line exists in order to ensure that the proper amount of current is carried with minimal resistance between the connected components.

When designing an integrated circuit, a designer creates a circuit description, including electrical connection of the components. The circuit description is input into a computer aided design (CAD) software package to form a three dimensional geometric image of the integrated circuit known as a layout. Software vending companies such as Cadence, Mentor Graphics, and Integrated Silicon Systems provide CAD software specially designed for integrated circuit design and manufacture.

Typically, a CAD system for designing integrated circuits contains several components to assist with circuit design, for example: a schematic editor, a logic compiler, a logic simulator, a logic verifier, and a layout program. The schematic editor allows designers to create and/or modify a schematic diagram, i.e., circuit description, using the computer's display and input devices, and generates a net list, i.e., a summary of connections between components, in the process. The logic compiler receives the net list as input, and utilizing a component database, writes the necessary information for layout, verification, and simulation into a schematic object file having a format specifically optimized for layout, verification, and simulation. The logic verifier checks the schematic diagram for design errors, such as multiple outputs connected together, overloaded signal paths, etc., and generates error indications if any such design problems exist. The logic simulator uses the schematic object file and simulation models created by the designer, and generates a set of simulation results, based upon instructions, initial conditions, and input signal values provided either in the form of a file or as user input.

The layout program generates geometric data from which a semiconductor chip, circuit board, integrated circuit, or other electronic device is laid out and produced. Generally, a layout comprises a set of geometric shapes contained in several layers. In a layout, metal lines are represented as trenches in a layer, and vias are represented as holes in a layer. Typically, the layout is checked to ensure that it meets all of the design requirements, e.g., that there are a sufficient number of vias between a particular upper metal line and a lower metal line to carry the requisite current between the metal lines. However, layouts are not checked to ensure that connections between vias and metal lines will be complete in light of increasing process variations that occur during manufacture of increasingly smaller integrated circuits. The result is a set of design files that describes the layout. The design files are then converted into pattern generator files used to produce patterns by an optical or electron beam pattern generator that are called masks. Masks are then utilized to print the layout onto a wafer using photolithography techniques.

Figure 1:
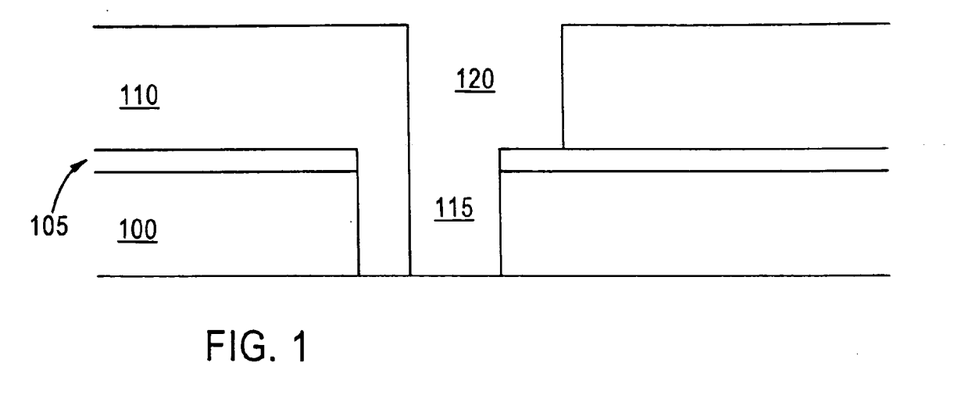
FIG. 1 is a front sectional view of a metal line trench that is misaligned with an underlying via taken along line AA of FIG. 2.
Figure 2:
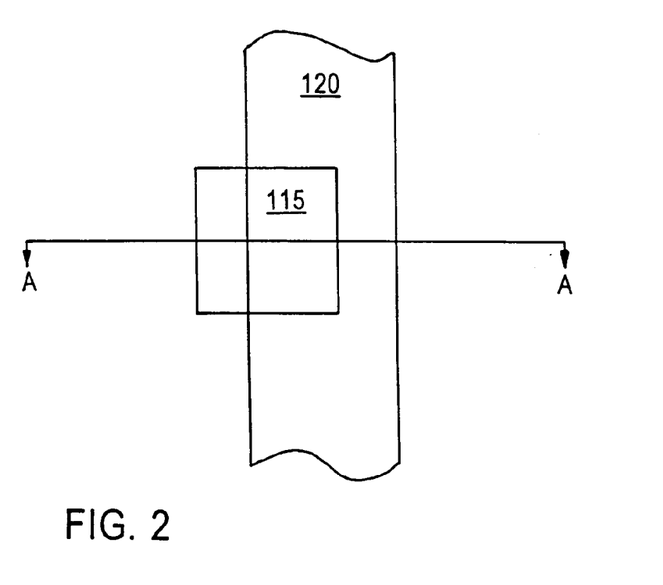
FIG. 2 is a top view of the misaligned metal trench and underlying via depicted in FIG. 1.

Current CAD programs and design rules for creating integrated circuits are geared towards generating integrated circuit layouts using past technologies and larger design sizes, and are proving to be inadequate, especially as new, more compact integrated circuit technologies outpace improvements to the equipment used to manufacture integrated circuits. A difficult problem to resolve resulting from more compact integrated circuit designs relates to partial connections between vias and overlying metal trenches, i.e., when a via does not align with its overlying metal trench, as depicted in FIGS. 1 and 2. Current CAD programs and design rules permit vias to be drawn coincident with a metal edge, which often results in substantially complete via-to-metal connections when they are actually manufactured using current technologies and integrated circuit design sizes. This is because advanced integrated circuit design sizes continue to shrink and become more compact, but the technologies used to manufacture integrated circuits remain relatively static. The decreasing integrated circuit design sizes combined with older manufacturing technologies results in wider process variations and less control over the precise placement of vias and metal lines into a manufactured integrated circuit. For example, vias that were drawn to be coincident with the metal edge will not be fully on top of or below their corresponding metal lines after integrated circuit manufacture. This is because precisely placing and sizing the newer, smaller vias and metal lines is slightly beyond the capabilities of current masking and photolithography technologies employed to manufacture shrunk integrated circuit designs.

In the past, when such partial via-to-metal connections resulted from an integrated circuit design, they were corrected by a layout person who manually corrected the integrated circuit design. Today, with automatically created layouts, the asymmetrical metal lines necessary to correct the via-to-metal connection problems arising from compact integrated circuit designs are not automatically generated by CAD programs. Current CAD software lacks knowledge of process variations that result in partial connections between vias and metal lines, and therefore cannot lay out a metal line that is assured of making a full connection with each underlying via. Layouts resulting in incomplete connections between vias and metal lines are either edited by hand to account for the process variations and correct the incomplete connections between vias and their respective metal lines, which increases the development time and cost of an integrated circuit, or are left containing the incomplete connections between vias and metal lines, which reduces the efficiency of the integrated circuit and causes potential overheating/burnout problems.

SUMMARY OF THE INVENTION

There is a need for modifying automatically generated circuit layouts to correct incomplete connections between vias and metal lines that result from increasingly important process variations during manufacture. There is also a need to enable CAD software to find and fix vias and metal lines in a circuit layout that are likely to result in an incomplete connection when the integrated circuit is manufactured without creating electrical interference between adjacent metal lines.

These needs and others are met by embodiments of the present invention which provide a method and apparatus for identifying particular vias in a circuit layout that will result in incomplete connections to metal lines when the integrated circuit is manufactured. Based upon design rules, 3 sigma size and positioning error factors for the technology embodied in the circuit design, and measurements of the metal lines, the present invention enlarges metal lines that contact a via edge to ensure a complete connection between the via and metal line when the integrated circuit is manufactured. Additionally, the present invention reduces adjacent metal lines when necessary in order to prevent electrical impact between an enlarged metal line and its neighboring metal line.

Accordingly, one aspect of the invention relates to a method for generating circuit layouts. The method selects at least one via that has at least one edge touching an edge of an overlying metal line, and measures a distance between the edge of the overlying metal line and an edge of an adjacent metal line. If the distance between the touched edge of the overlying metal line and the edge of the adjacent metal line is at least a predetermined distance, then the size of the overlying metal line is increased. If the distance between the touched edge of the overlying metal line and the edge of the adjacent metal line is less than the predetermined distance, then a size of the overlying metal line is increased and a size of the adjacent metal line is decreased.

Another aspect of the invention relates to a method for generating circuit layouts that makes several determinations. The method determines a minimum distance between metal lines based upon design rules that allows one metal line to be increased by a first oversize. The method determines the first oversize based upon a 3 sigma via-to-metal size and positioning error factor for the technology embodied in the circuit layout. A determination of a delta distance based upon simulated and experimental measurements of metal lines in the circuit layout such that a metal line reduced by at least the delta distance will not impact an adjacent metal line that is increased by a second oversize is made. The method also determines the second oversize based upon the simulated and experimental measurements of metal lines in the circuit layout such that increasing a metal line by the second oversize will not impact an adjacent metal line that has been decreased by at least the delta distance. Then, a first layout layer containing vias is identified, and a second layout layer containing metal lines that contact the vias in the first layer is identified. Vias that do not fully contact a metal line based upon whether at least one edge of a via touches an edge of an overlying metal line are selected and grouping the selected vias into a first via group is performed. Vias in the first via group are selected based upon whether a distance from the overlying metal line edge to an edge of an adjacent metal line is at least the minimum distance, and grouping these selected vias into a second via group is made. The metal lines contacting vias in the second via group are then resized by increasing the size of the metal lines by the first oversize. The size of metal lines that contact vias from the first via group that are not in the second via group is increased by the second oversize, and the size of metal lines adjacent to the edge of a metal line touched by a via from the first via group that is not in the second via group is decreased by at least the delta distance.

Another aspect of the present invention relates to an apparatus for generating circuit layouts comprising a central processing unit; a display; and at least an input device. The central processing unit carries out the step of making a determination of a minimum distance between metal lines based upon design rules that allows one metal line to be increased by a first oversize. The first oversize is determined based upon a 3 sigma via-to-metal size and positioning error factor for the technology embodied in the circuit layout. A delta distance is determined based upon simulated and experimental measurements of metal lines in the circuit layout such that a metal line reduced by at least the delta distance will not impact an adjacent metal line that is increased by a second oversize. The second oversize is determined based upon the simulated and experimental measurements of metal lines in the circuit layout such that increasing a metal line by the second oversize will not impact an adjacent metal line that has been decreased by at least the delta distance. A first layout layer containing vias, and a second layout layer containing metal lines that contact the vias in the first layer are identified. Vias that do not fully contact a metal line are selected based upon whether at least one edge of a via touches an edge of an overlying metal line and the selected vias are grouped into a first via group. Vias in the first via group are selected based upon whether a distance from the overlying metal line edge to an edge of an adjacent metal line is at least the minimum distance, and these selected vias are grouped into a second via group. The metal lines contacting vias in the second via group are resized by increasing the size of the metal lines by the first oversize. The metal lines that contact vias from the first via group that are not in the second via group are resized by increasing the size of the metal lines by the second oversize. And, the metal lines adjacent to the edge of a metal line touched by a via from the first via group that is not in the second via group are resized by decreasing adjacent metal lines by at least the delta distance.

Another aspect of the present invention relates to an apparatus for generating circuit layouts comprising a central processing unit; a display; and at least an input device. The central processing unit carries out the step of selecting at least one via that has at least one edge touching an edge of an overlying metal line. A distance is measured between the edge of the overlying metal line and an edge of an adjacent metal line. If the distance between the touched edge of the overlying metal line and the edge of the adjacent metal line is at least a predetermined distance, then a size of the overlying metal line is increased. If the distance between the touched edge of the overlying metal line and the edge of the adjacent metal line is less than the predetermined distance, then a size of the overlying metal line is increased and a size of the adjacent metal line is decreased.

Utilizing a computer program to check computer generated circuit layouts for connections between vias and metal lines that will be incomplete when the integrated circuit is manufactured improves the circuit device manufactured from the circuit layout without substantially increasing the design time or cost of manufacturing the circuit device. A computer program checks an entire circuit layout in a fast and efficient manner, and automatically corrects via-to-metal line connections without requiring a human CAD operator to sort through the circuit layout looking for and manually correcting via-to-metal connections.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention addresses and solves problems related to vias incompletely connected to metal lines in a circuit device manufactured from a circuit layout automatically generated by CAD software that fails to account for increasing process variations and lack of precise control over the manufacture of shrunk integrated circuit designs. This is achieved by providing a method for identifying each via that is incompletely connected to its associated metal line and increasing the size of the metal line, preferably locally around the via. An apparatus for solving problems related to vias incompletely connected to their associated metal lines in shrunk integrated circuits manufactured from layouts automatically generated by CAD software comprises a computer programmed to search a digital layout of a circuit for each via with at least an edge coincident to its associated metal line. The computer then increases the size of the metal line according to design rules stating minimum distances between metal lines, 3 sigma via-to-metal size and positioning error factors for the technology embodied in the circuit layout, and simulated and experimental measurements of the metal lines.

Figure 3:
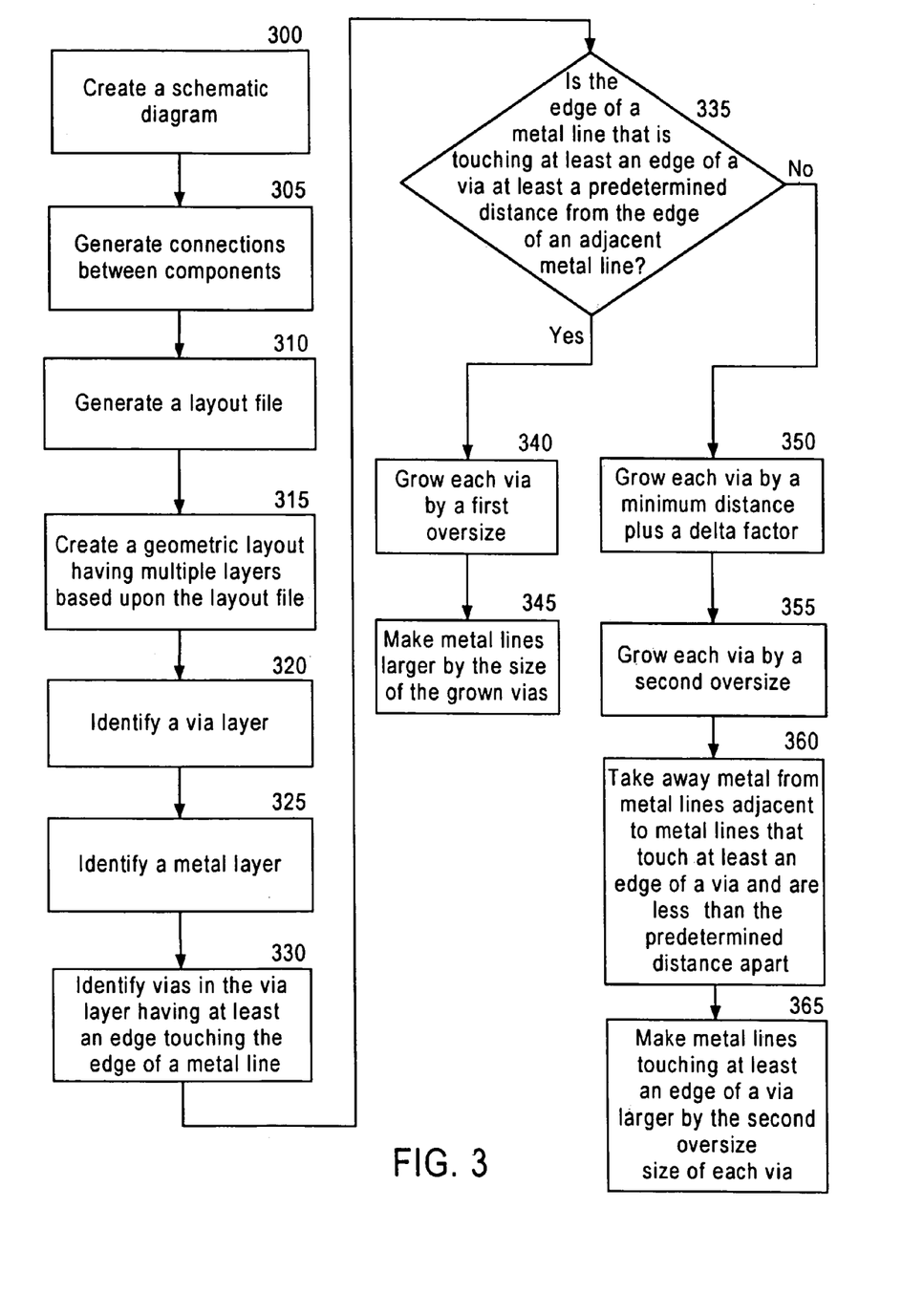
FIG. 3 is a process flow depicting creation of an integrated circuit layout and checking the layout for incomplete connections between vias and metal lines.

Referring now to the drawings and initially to FIG. 3, a method for correcting connections between vias and metal lines in accordance with the present invention is described. At step 300, a designer creates a schematic diagram for a circuit, as is well known in the art, utilizing CAD software developed for designing circuits, for example, software available from Cadence, Mentor Graphics, Integrated Silicon Systems, and other CAD vendors. At step 305 the designer, using CAD software, generates connections between the components in the schematic diagram, and a layout file is generated at step 310. At step 315 the CAD software creates a geometric layout utilizing the layout file. The geometric layout has multiple layers, and is based upon the layout file created in step 310 and the connection information generated at step 305. Because the geometric layout was generated by the CAD software, metal lines in the geometric layout have straight edges, and each metal line contacts vias that the metal line cooperates with to electrically connect components in the circuit layout. Ideally, each metal line fully contacts each via that the metal line cooperates with. However, due to physical space limitations in the circuit layout, and the CAD software, often an edge of a via is coincident to an edge of its corresponding metal line resulting in a misaligned via-to-metal contact when manufactured, as depicted between metal line 120 and via 115 in FIGS. 1 and 2.

In order to correct incomplete connections between vias and metal lines when an integrated circuit is manufactured from the layout, certain embodiments of the present invention review geometric circuit layouts and modify metal lines as necessary. At step 320 a via layer 610 (FIG. 6) is identified. For example, in FIG. 6 layer 610 contains via 405, as well as other vias that are not shown, and is therefore a via layer. A metal layer 600 (FIG. 6) is identified at step 325. For example, in FIG. 6 layer 600 contains metal line (shown as 615 and 400), as well as other metal lines that are not shown, and is therefore a metal line layer. Via layers and metal line layers are identifiable in various manners. For example, a computer programmed to recognize geometric shapes, as is well known in the art, categorizes the shapes as various components in a circuit layout. When the computer recognizes via structures within a layout layer the computer designates that layer as a via layer. Likewise, when the computer recognizes metal line structures within a layout layer the computer designates that layer as a metal line layer. Another exemplary method is to cause the CAD software to tag layers as either a via layer or as a metal line layer when the circuit layout is generated. How a layer is identified as either a via layer or as a metal line layer is not critical, and therefore other methods are within the scope of the present invention. Additionally, it is not critical whether the via layers and metal line layers are represented in two dimensional form, i.e., a pattern generator file, or in three dimensional form, i.e., a layout as modifications to either form by the present invention results in a circuit layout containing complete contact between vias and metal lines that were previously incomplete.

At step 330 vias in the via layer 610 that have at least an edge touching an edge of a metal line are identified. Examples of vias having at least an edge touching an edge of a metal line are depicted as via 115 in FIG. 1, via 405 in FIG. 4, and via 710 in FIG. 7. When via layers and metal line layers are in two dimensional form, an example of identifying whether a via edge touches a metal line comprises labeling lines as either belonging to a via or to a metal line, overlying the two layers, and checking for intersections of via lines and metal line lines. An exemplary manner for identifying vias in three dimensional form having edges that touch an edge of a metal line comprises utilizing existing commands in CAD software packages and/or geometric manipulation software that are designed to determine whether an edge in one layer is coincident with an edge in another layer, i.e., if the two layers were collapsed into a single plane would the edges intersect? Other methods such as coordinate mapping and etc. are contemplated as within the scope of the present invention.

At step 335 a determination is made whether the edge of a metal line that is touching at least an edge of a via is at least a minimum distance from the edge of an adjacent metal line. Such a minimum distance is determined by a designer, and is typically embodied in a design rule specifying the distance required between metal lines where one of the metal lines is going to undergo an increase in size. The minimum distance is such that one metal line is increased by a 3 sigma via-to-metal size and positioning error factor without electrically impacting adjacent metal lines. The increase in size of a metal line in association with this predetermined minimum distance is typically based upon a 3 sigma via-to-metal size and positioning error factor for the technology embodied in the circuit layout. Such error factors are well known in the art and are readily determined based upon the technology the designer is incorporating into the circuit design.

Figure 4:
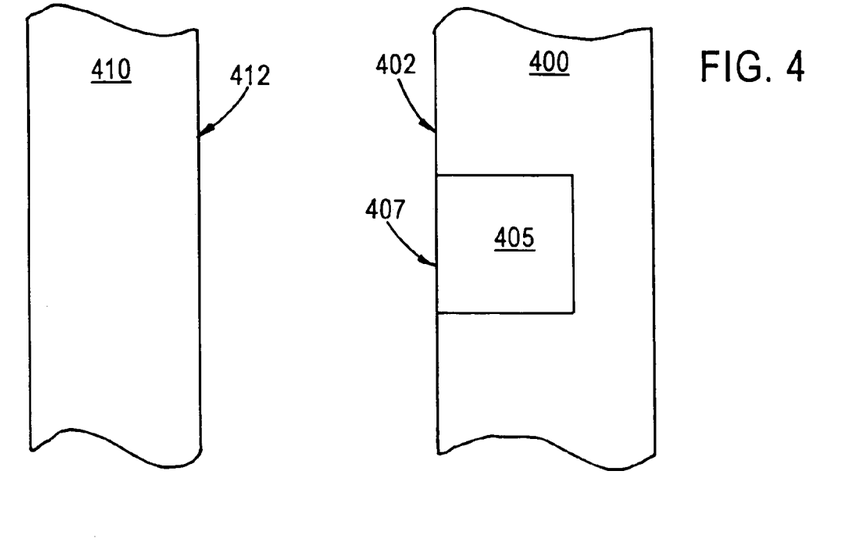
FIG. 4 is a top view of a metal line edge touching at least an edge of a via, where the metal line edge is at least a predetermined, minimum distance from the edge of an adjacent via.

FIG. 4 depicts a via 405 having at least an edge 407 that touches an edge 402 of metal line 400. The edge 402 that via 405 touches is more than a predetermined, minimum distance from the edge 412 of the adjacent metal line 410. Because there is more than a predetermined minimum distance between the edge 402 of metal line 400 and the edge 412 of metal line 410, as determined at step 335, the size of metal line 400 can be made larger taking into account the 3 sigma via-to-metal size and positioning error factor for the technology embodied in the circuit layout without causing electrical interference between metal line 400 and metal line 410.

Figure 5:
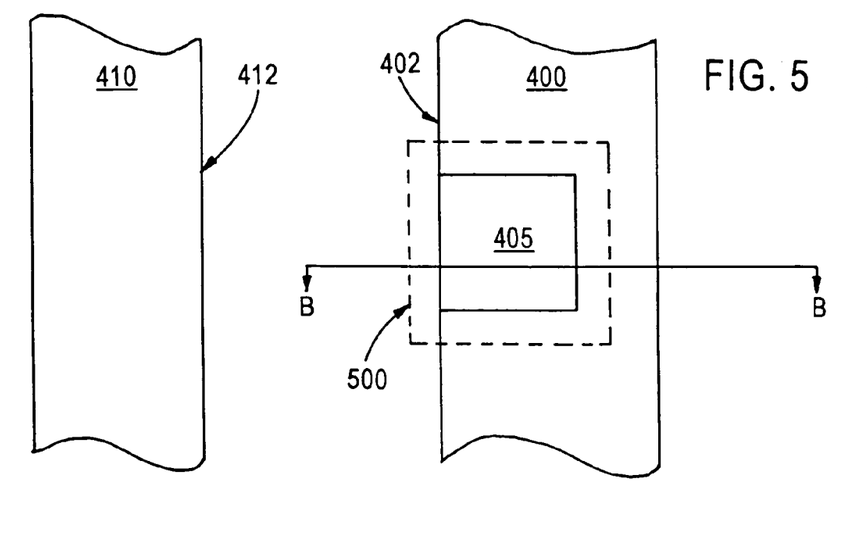
FIG. 5 is a top view of a temporary via layer, where the via from FIG. 4 has been enlarged by a first oversize.
Figure 6:
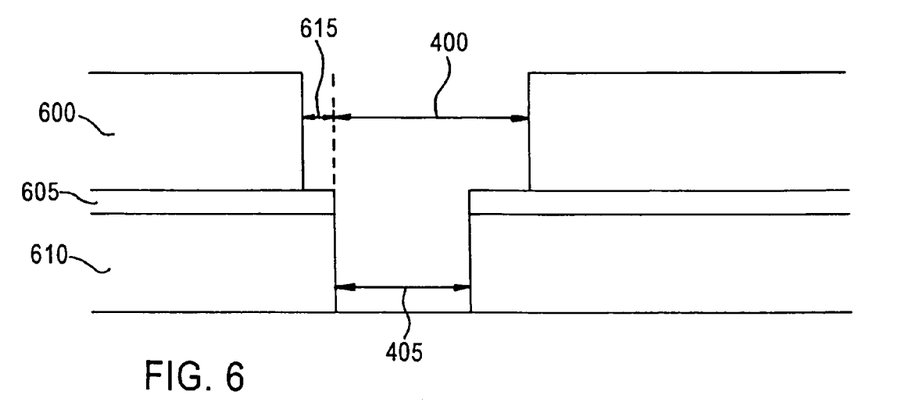
FIG. 6 is a front, sectional view taken along line BB in FIG. 5 depicting a front sectional view of the metal line depicted in FIG. 5.

An exemplary method for increasing the size of metal line 400 involves creating a temporary layer. At step 340 the temporary layer, depicted in FIG. 5, contains via 500 which represents via 405 from FIG. 4 enlarged by an oversize amount that corresponds to the 3 sigma via-to-metal size and positioning error factor. The temporary layer is positioned such that via 500 is concentric with via 405. Each enlarged via, not shown, in the temporary layer is also concentric with respect to an original via, not shown, in the via layer. For simplicity, only via 405 is described in detail, however, one of ordinary skill in the art recognizes that processing occurs for other vias either sequentially or in batches depending upon the design of a computer program embodying an aspect of the present invention. The edges of via 500 form a polygon, as depicted in FIG. 5, on the top surface of the via layer 610 (FIG. 6). At step 345 the polygon formed by via 500 in the temporary layer is extruded, i.e., projected, into the metal layer 600 (FIG. 6), thus forming a new geometric shape that intersects the metal line 400 in the metal layer 600. Metal line 400 is then defined as the area (if represented in two-dimensional form) or volume (if represented in three-dimensional form) of the original metal line 400 plus the area/volume of the new geometric shape formed by projecting the polygon defined by via 500 into the metal layer. This results in a new metal line 400 with a bulge in it, similar to metal line 120 depicted in FIG. 2. When the circuit layout is utilized to manufacture the designed circuit, specifically the vias and metal lines, as by a dual-damascene process, for example, the bulge portion of metal line 400 has the same height as the rest of metal line 400. FIG. 6 depicts a front, sectional view of the new metal line 400 taken along line BB of FIG. 5. As depicted in FIG. 6, metal line 400, in the vicinity of via 405, comprises original portion 400, plus an additional portion 615 that was created as a result of extruding the polygon formed by via 500 in the temporary layer. Other methods of geometric manipulation result in increasing the size of a metal line in the vicinity of a via, and are within the scope of the present invention.

Figure 7:
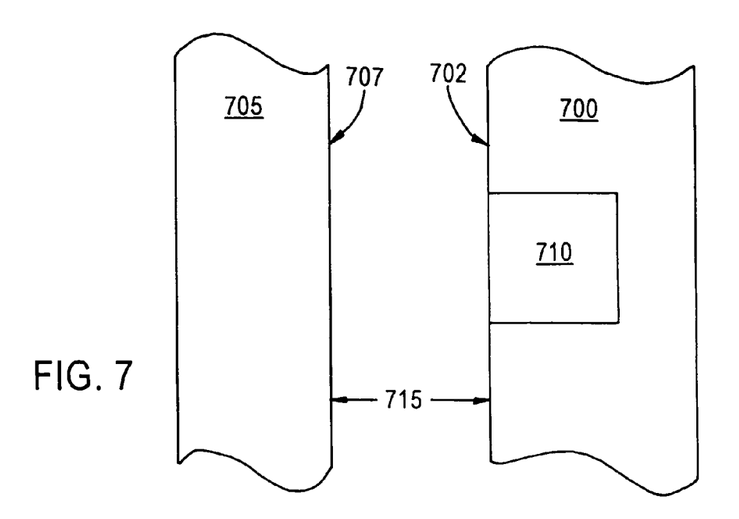
FIG. 7 is a top view depicting a via that has at least an edge touching an edge of a metal line, where the edge of the metal line is less than a predetermined minimum distance to the edge of an adjacent metal line.
Figure 8:
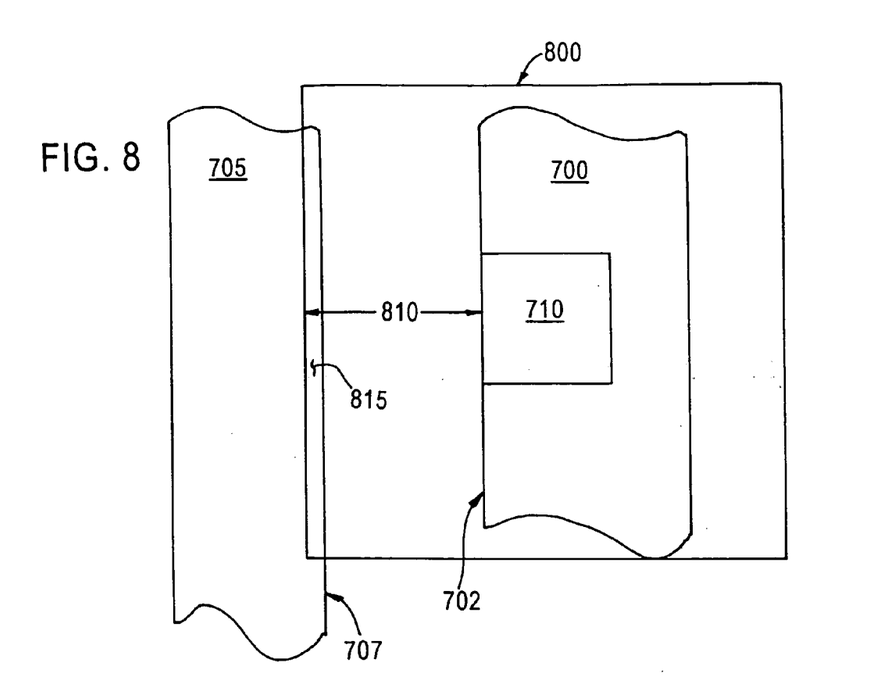
FIG. 8 is a top view of a temporary via layer, where the via from FIG. 7 has been enlarged by the predetermined minimum distance plus a delta distance.

FIG. 7 depicts a situation where the distance 715 between edge 702 touched by the via 710 and the edge 707 of an adjacent metal line 705 is less than a predetermined minimum distance. At step 350 the via 710 is enlarged to a size that accounts for the predetermined minimum distance plus a delta distance. FIG. 8 depicts a first temporary via layer where the via 710 has been enlarged by the predetermined minimum distance plus a distance delta, i.e., distance 810, to form via 800. The delta distance, determined by an evaluation of simulated and experimental measurements of the metal lines as is well known in the art, is used to decrease the size of a metal line 705 that is the minimum distance or less from a metal line 700 whose size is increased. The reason for using a delta distance in addition to the minimum distance is to ensure that the enlarged metal line 700 does not electrically affect an adjacent metal line 705. For example, the delta distance is determined in conjunction with a second oversize so that the newly sized metal line 700, i.e., increased by the second oversize, will not impact the line 705, which is reduced by a size that accounts for the predetermined minimum distance and the delta distance. Use of the delta distance maintains adequate separation between resized metal lines and adjacent metal line 705. For example, if the delta distance equals the second oversize, then the closest that a resized metal line 700 will be to an adjacent metal line 705 is the minimum distance.

Figure 9:
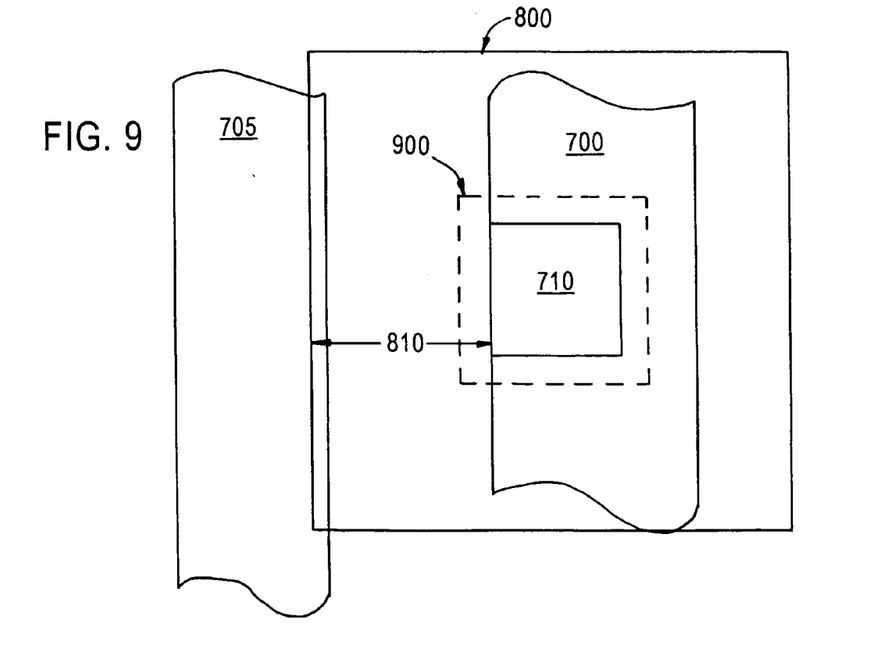
FIG. 9 is a top view of another temporary via layer where the via from FIG. 7 has been enlarged by a second oversize.

At step 355 the via 710 is increased by the second oversize. FIG. 9 depicts a second temporary via layer where the via 710 has been increased by a size corresponding to the second oversize to form via 900. The second oversize also accounts for a three-sigma via-to-metal error factor and additionally accounts for the delta distance so that metal line 700 is not enlarged too much.

Figure 10:
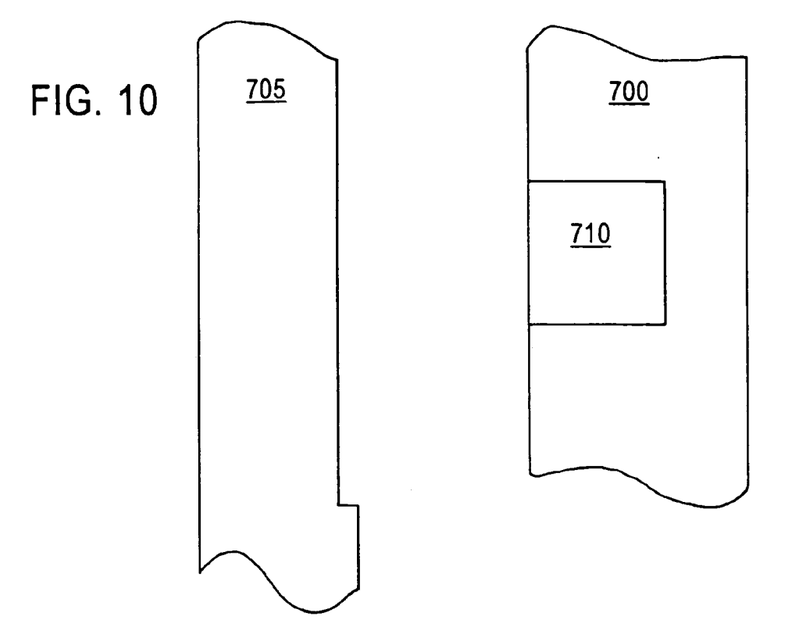
FIG. 10 is a top view where the size of one of the metal lines from FIG. 7 has been reduced.

At step 360 the size of metal line 705 is reduced so that there will not be an impact on metal line 705 by the newly resized metal line 700. Utilizing programming techniques similar to those utilized to determine whether a via edge touches a metal line edge, a determination is made as to where via 800 intersects metal line 705 that is adjacent to the metal line 700 that via 710 contacts. Alternatively, geometric manipulation routines contained in software such as Mentor Graphics CALIBRE™ are used to determine where via 800 intersects metal line 705, i.e., metal lines that are not the metal line 700 that via 710 intersects. Other techniques for determining intersections of geometric shapes fall within the scope of the present invention. Intersection between via 800 and metal line 700 contacting via 710 is not utilized for reducing the size of metal lines. The intersection of via 800 and metal line 705 defines a polygon on the top surface of the via layer, i.e., area 815 in FIG. 8. The polygon 815 is then extruded, i.e., projected, into the metal layer to create a new geometric shape that is contained within original metal line 705. Metal line 705 is then defined as original metal line 705 minus the new geometric shape defined by area 815, thus metal line 705 is reduced by a size that accounts for the predetermined minimum distance plus the delta distance, as depicted in FIG. 10.

Figure 11:
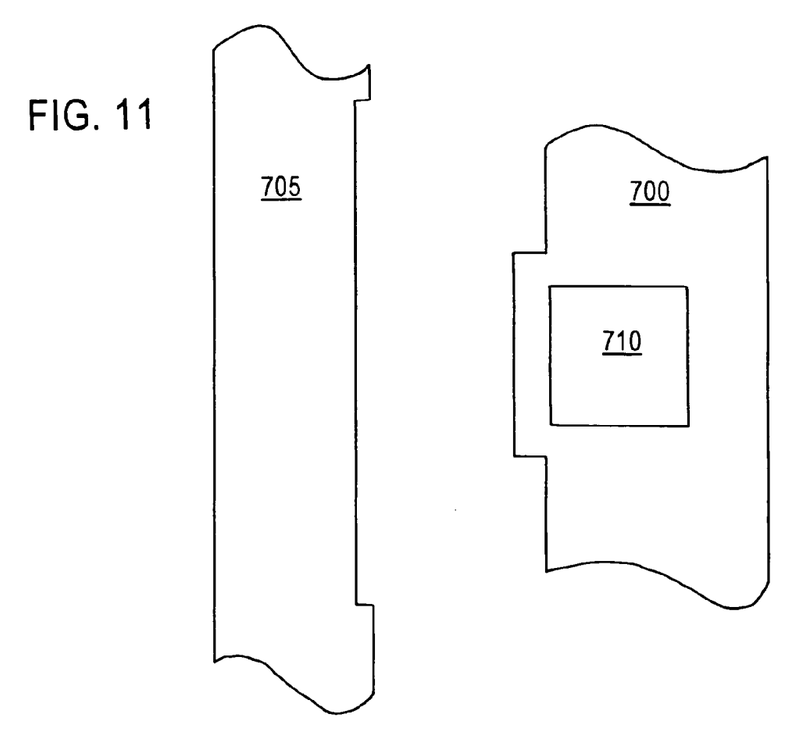
FIG. 11 is a top view where the size of one of the metal lines from FIG. 7 has been reduced and the size of the other metal line from FIG. 7 has been increased.

The size of metal line 700 is then increased at step 365 by the second oversize, for example, utilizing the method outlined for increasing metal line 400 by the first oversize, as depicted in FIG. 11.

The present invention provides complete connections between vias and metal lines in integrated circuits manufactured from computer generated circuit layouts without intensive, manual checking of a circuit layout. Metal lines are increased in size where a via touches an edge of a metal line to ensure adequate connection between the via and the metal line. Some adjacent metal lines are reduced in size in order to maintain an adequate distance between an enlarged metal line and the adjacent metal line. Such reduction of adjacent metal lines insures against electrical interference between a metal line that has been enlarged to provide adequate connection to a via and an adjacent metal line when necessary.

Hardware Overview

Figure 12:
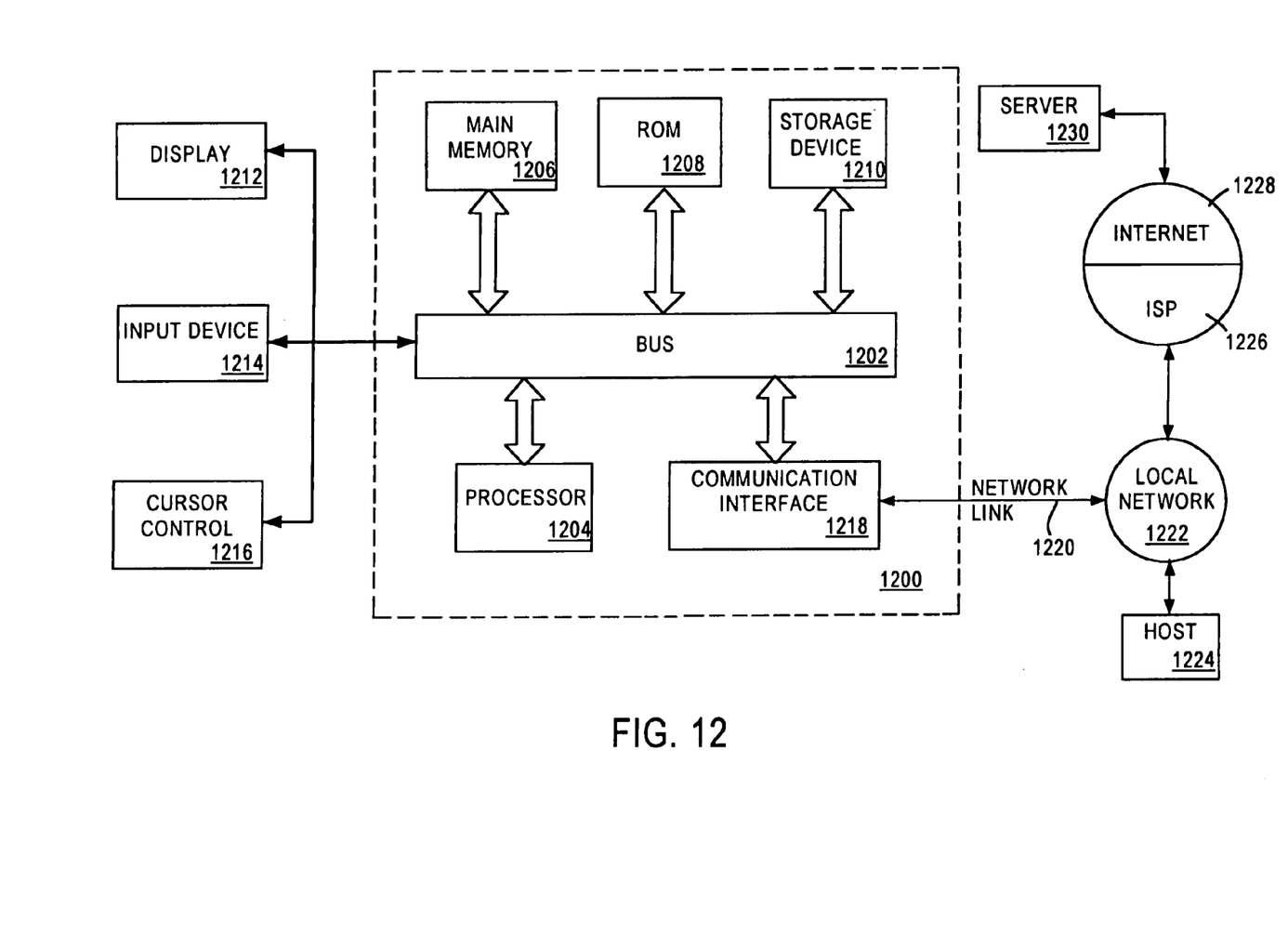
FIG. 12 is a block diagram of an exemplary computer system on which the present invention operates.

FIG. 12 is a block diagram that illustrates a computer system 1200 upon which an embodiment of the invention may be implemented. Computer system 1200 includes a bus 1202 or other communication mechanism for communicating information, and a processor 1204 coupled with bus 1202 for processing information. Computer system 1200 also includes a main memory 1206, such as a random access memory (RAM) or other dynamic storage device, coupled to bus 1202 for storing information and instructions to be executed by central processor 1204. Main memory 1206 also may be used for storing temporary variables or other intermediate information during execution of instructions to be executed by processor 1204. For example, a temporary via layer containing enlarged vias is stored in main memory 1206 until metal lines have been resized. Computer system 1200 further includes a read only memory (ROM) 1208 or other static storage device coupled to bus 1202 for storing static information and instructions for central processor 1204. A storage device 1210, such as a magnetic disk or optical disk, is provided and coupled to bus 1202 for storing information and instructions.

Computer system 1200 may be coupled by bus 1202 to a display 1212, such as a cathode ray tube (CRT), for displaying information to a computer user. An input device 1214, including alphanumeric and other keys, is coupled to bus 1202 for communicating information and command selections to central processor 1204. Another type of user input device is cursor control 1216, such as a mouse, a trackball, or cursor direction keys for communicating direction information and command selections to central processor 1204 and for controlling cursor movement on display 1212. This input device typically has two degrees of freedom in two axes, a first axis (e.g., x) and a second axis (e.g., y), that allows the device to specify positions in a plane.

The invention is related to the use of computer system 1200 for checking a computer generated circuit layout for vias that will result in incomplete connections to metal lines, i.e., vias with edges coincident to an edge of a metal line. The invention also uses computer system 1200 to resize metal lines in the computer generated circuit layout in order to ensure complete contact between the metal lines and vias. According to certain embodiments of the invention, checking for coincident edges between vias and metal lines and resizing metal lines is provided by computer system 1200 in response to central processor 1204 executing one or more sequences of one or more instructions contained in main memory 1206. Such instructions may be read into main memory 1206 from another computer-readable medium, such as storage device 1210. Execution of the sequences of instructions contained in main memory 1206 causes central processor 1204 to perform the process steps described supra. One or more processors in a multi-processing arrangement may also be employed to execute the sequences of instructions contained in main memory 1206. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to central processor 1204 for execution. Such a medium may take many forms, including but not limited to, non-volatile media, volatile media, and transmission media. Non-volatile media include, for example, optical or magnetic disks, such as storage device 1210. Volatile media include dynamic memory, such as main memory 1206. Transmission media include coaxial cables, copper wire and fiber optics, including the wires that comprise bus 1202. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions for identifying coincident edges between vias and metal lines, and for resizing metal lines, to central processor 1204 for execution. For example, the instructions may initially be borne on a magnetic disk of a remote computer. The remote computer can load the instructions into its dynamic memory and send the instructions over a telephone line using a modem. A modem local to computer system 1200 can receive the data on the telephone line and use an infrared transmitter to convert the data to an infrared signal. An infrared detector coupled to bus 1202 can receive the data carried in the infrared signal and place the data on bus 1202. Bus 1202 carries the data to main memory 1206, from which central processor 1204 retrieves and executes the instructions. The instructions received by main memory 1206 may optionally be stored on storage device 1210 either before or after execution by central processor 1204.

Computer system 1200 also includes a communication interface 1218 coupled to bus 1202. Communication interface 1218 provides a two-way data communication coupling to a network link 1220 that is connected to a local network 1222. For example, communication interface 1218 may be an integrated services digital network (ISDN) card or a modem to provide a data communication connection to a corresponding type of telephone line. As another example, communication interface 1218 may be a local area network (LAN) card to provide a data communication connection to a compatible LAN. Wireless links may also be implemented. In any such implementation, communication interface 1218 sends and receives electrical, electromagnetic or optical signals that carry digital data streams representing various types of information.

Network link 1220 typically provides data communication through one or more networks to other data devices. For example, network link 1220 may provide a connection through local network 1222 to a host computer 1224 or to data equipment operated by an Internet Service Provider (ISP) 1226. ISP 1226 in turn provides data communication services through the worldwide packet data communication network, now commonly referred to as the "Internet" 1228. Local network 1222 and Internet 1228 both use electrical, electromagnetic or optical signals that carry digital data streams. The signals through the various networks and the signals on network link 1220 and through communication interface 1218, which carry the digital data to and from computer system 1200, are exemplary forms of carrier waves transporting the information.

Computer system 1200 can send messages and receive data, including program code, through the network(s), network link 1220, and communication interface 1218. In the Internet example, a server 1230 might transmit a requested code for an application program through Internet 1228, ISP 1226, local network 1222 and communication interface 1218. In accordance with the invention, one such downloaded application provides for checking a computer generated circuit layout for incompletely connected via and metal lines and resizing metal lines to complete such incomplete connections as described herein.

The received code may be executed by central processor 1204 as it is received, and/or stored in storage device 1210, or other non-volatile storage for later execution. In this manner, computer system 1200 may obtain application code in the form of a carrier wave.

The present invention may be embodied in a computer system as described above, or it may be a program designed to operate on any configuration for a computer system.

An advantage of the present invention is that it provides complete connection between vias and metal lines in a manufactured, shrunk integrated circuit. The present invention provides enough of an overlap between a via and a metal line to satisfy a 3 sigma via-to-metal size and positioning error factor while ensuring that there is no electrical impact by a resized metal line upon an adjacent metal line.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A method for generating a circuit layout comprising:
   selecting at least one via that has at least one edge touching an edge of an overlying metal line;
   measuring a distance between the edge of the overlying metal line and an edge of an adjacent metal line;
   if the distance between the touched edge of the overlying metal line and the edge of the adjacent metal line is at least a predetermined distance, then increasing the dimension of the overlying metal line; and
   if the distance between the touched edge of the overlying metal line and the edge of the adjacent metal line is less than the predetermined distance, then increasing a dimension of the overlying metal line and decreasing a dimension of the adjacent metal line.

2. The method according to claim 1, comprising increasing the dimension of the overlying metal line in a vicinity of the via.

3. The method according to claim 2, comprising increasing the dimension of the overlying metal line according to a 3 sigma via-to-metal dimension and positioning error factor for the technology embodied in the computer generated circuit layout.

4. The method according to claim 2, if the distance between the touched edge of the overlying metal line and the edge of the adjacent metal line is less than the predetermined distance, comprising:
   decreasing a dimension of the adjacent metal line by an amount that accounts for the predetermined distance and a distance delta that is determined from evaluation of simulated and experimental measurements of a distance where one metal line does not impact an adjacent metal line; and
   increasing a dimension of the overlying metal line by an amount based upon evaluation of simulated and experimental measurements of a distance where one metal line does not electrically impact an adjacent metal line.

5. The method according to claim 1, further comprising:
   designating the selected vias as a first group;
   designating vias from the first group that touch an overlying metal line where the distance between the overlying metal line and the edge of the adjacent metal line is at least a predetermined distance into a second group;
   designating vias from the first group that are not in the second group into a third group; and
   increasing the dimension of overlying metal lines for metal lines touching vias in the second group.

6. The method according to claim 5, further comprising:
   increasing a dimension of overlying metal lines and decreasing a dimension of adjacent metal lines for metal lines touching vias in the third group.

7. A method for generating a circuit layout comprising:
   determining a minimum distance between metal lines based upon design rules that allows one metal line to be increased by a first oversize;
   determining the first oversize based upon a 3 sigma via-to-metal dimension and positioning error factor for the technology embodied in the circuit layout;
   determining a delta distance based upon simulated and experimental measurements of metal lines in the circuit layout such that a metal line reduced by at least the delta distance will not electrically impact an adjacent metal line that is increased by a second oversize;
   determining the second oversize based upon simulated and experimental measurements of metal lines in the circuit layout such that increasing the metal line by the second oversize will not electrically impact the adjacent metal line that has been decreased by at least the delta distance;
   identifying a first layout layer containing vias;
   identifying a second layout layer containing metal lines that contact vias that are in the first layer;
   selecting vias that do not fully contact the metal line based upon whether at least one edge of the via touches an edge of the overlying metal line, and grouping the selected vias into a first via group;
   selecting vias in the first via group based upon whether a distance from the overlying metal line edge to an edge of the adjacent metal line is at least the minimum distance and grouping these selected vias into a second via group;

increasing a dimension of the overlying metal lines that contact vias in the second via group by the first oversize;

increasing a dimension of metal lines that contact vias in the first via group that are not in the second via group by the second oversize; and decreasing a dimension of adjacent metal lines to each overlying metal line touched by the via in the first via group that is not in the second via group by at least the delta distance.

8. The method according to claim 7, wherein increasing a dimension of the overlying metal lines that contact vias in the second via group comprises:

increasing a dimension of the vias in the second via group by the first oversize;

projecting the increased dimension of the vias in the second via group onto the overlying metal lines that contact the vias in the second via group; and incorporating as part of the metal lines that contact the vias in the second via group the projected, increased dimension of the vias in the second via group.

9. The method according to claim 7, wherein increasing a dimension of the overlying metal lines that contact vias in the first via group that are not in the second via group comprises:

increasing a dimension of the vias in the first via group that are not in the second via group by the second oversize;

projecting the increased dimension of the vias in the first via group that are not in the second via group onto the overlying metal lines that contact the vias in the first via group that are not in the second via group; and incorporating as part of the overlying metal lines that contact the vias in the first via group that are not in the second via group the projected, increased dimension of the vias in the first via group that are not in the second via group.

10. The method according to claim 7, wherein decreasing a dimension of adjacent metal lines comprises:

increasing a dimension of the vias in the first via group that are not in the second via group by the minimum distance plus the delta distance;

identifying an intersection between each via increased by the minimum distance plus the delta distance and the adjacent metal lines;

projecting each intersection onto the adjacent metal lines; and removing the projected intersection from each adjacent metal line.

11. An apparatus for generating circuit layouts comprising:

a central processing unit;

a display; and at least an input device; wherein the central processing unit:

determines a minimum distance between metal lines based upon design rules that allows one metal line to be increased by a first oversize;

determining the first oversize based upon a 3 sigma via-to-metal dimension and positioning error factor for the technology embodied in the circuit layout;

determines a delta distance based upon simulated and experimental measurements of metal lines in the circuit layout such that the metal line reduced by at least the delta distance will not electrically impact the adjacent metal line that is increased by a second oversize;

determines the second oversize based upon simulated and experimental measurements of metal lines in the circuit layout such that increasing the metal line by the second oversize will not electrically impact the adjacent metal line that has been decreased by at least the delta distance;

identifies a first layout layer containing vias;

identifies a second layout layer containing metal lines that contact vias that are in the first layer;

selects vias that do not fully contact the metal line based upon whether at least one edge of the via touches an edge of the overlying metal line, and grouping the selected vias into a first via group;

selects vias in the first via group based upon whether a distance from the overlying metal line edge to an edge of the adjacent metal line is at least the minimum distance, and grouping these selected vias into a second via group;

increases a dimension of the overlying metal lines that contact vias in the second via group by the first oversize;

increases a dimension of metal lines that contact vias in the first via group that are not in the second via group by the second oversize; and decreases a dimension of adjacent metal lines to each overlying metal line touched by the via in the first via group that is not in the second via group by at least the delta distance.

12. An apparatus for generating circuit layouts comprising:

a central processing unit;

a display; and at least an input device; wherein the central processing unit:

selects at least one via that has at least one edge touching an edge of an overlying metal line;

measures a distance between the edge of the overlying metal line and an edge of an adjacent metal line;

if the distance between the touched edge of the overlying metal line and the edge of the adjacent metal line is at least a predetermined distance, then increases a dimension of the overlying metal line; and if the distance between the touched edge of the overlying metal line and the edge of the adjacent metal line is less than the predetermined distance, then increases a dimension of the overlying metal line and decreasing a dimension of the adjacent metal line.

13. A computer-readable medium bearing instructions for processing a computer generated circuit layout, said instructions, when executed, are arranged to cause a computer system to perform the steps of:

determining a minimum distance between metal lines based upon design rules that allows one metal line to be increased by a first oversize;

determining the first oversize based upon a 3 sigma via-to-metal dimension and positioning error factor for the technology embodied in the circuit layout;

determining a delta distance based upon simulated and experimental measurements of metal lines in the circuit layout such that a metal line reduced by at least the delta distance will not electrically impact an adjacent metal line that is increased by a second oversize;

determining the second oversize based upon simulated and experimental measurements of metal lines in the circuit layout such that increasing the metal line by the second oversize will not electrically impact the adjacent metal line that has been decreased by at least the delta distance;

identifying a first layout layer containing vias;

identifying a second layout layer containing metal lines that contact vias that are in the first layer;

selecting vias that do not fully contact the metal line based upon whether at least one edge of the via touches an edge of the overlying metal line, and grouping the selected vias into a first via group;

selecting vias in the first via group based upon whether a distance from the overlying metal line edge to an edge of the adjacent metal line is at least the minimum distance, and grouping these selected vias into a second via group;

increasing a dimension of the overlying metal lines that contact vias in the second via group by the first oversize;

increasing a dimension of metal lines that contact vias in the first via group that are not in the second via group by the second oversize; and decreasing a dimension of adjacent metal lines to each overlying metal line touched by the via in the first via group that is not in the second via group by at least the delta distance.

14. A computer-readable medium bearing instructions for processing a computer generated circuit layout, said instructions, when executed, are arranged to cause a computer system to perform the steps of:

selecting at least one via that has at least one edge touching an edge of an overlying metal line;

measuring a distance between the edge of the overlying metal line and an edge of an adjacent metal line;

if the distance between the touched edge of the overlying metal line and the edge of the adjacent metal line is at least a predetermined distance, then increasing a dimension of the overlying metal line; and if the distance between the touched edge of the overlying metal line and the edge of the adjacent metal line is less than the predetermined distance, then increasing the dimension of the overlying metal line and decreasing a size of the adjacent metal line.

* * * * *

UNITED STATES PATENT AND TRADEMARK OFFICE
CERTIFICATE OF CORRECTION

PATENT NO. : 7,076,750 B1 Page 1 of 1
APPLICATION NO. : 09/776735
DATED : July 11, 2006
INVENTOR(S) : Todd Lukanc It is certified that error appears in the above-identified patent and that said Letters Patent is hereby corrected as shown below:

Column 14, line 45, change the "a" at the end of the line to -- the --.

Signed and Sealed this

Twenty-sixth Day of December, 2006

JON W. DUDAS
*Director of the United States Patent and Trademark Office*